United States Patent
Moody et al.

(10) Patent No.: US 9,748,409 B2
(45) Date of Patent: Aug. 29, 2017

(54) POWER SEMICONDUCTOR DEVICES INCORPORATING SINGLE CRYSTALLINE ALUMINUM NITRIDE SUBSTRATE

(71) Applicant: HEXATECH, INC., Morrisville, NC (US)

(72) Inventors: Baxter Moody, Raleigh, NC (US); Seiji Mita, Cary, NC (US); Jinqiao Xie, Allen, TX (US)

(73) Assignee: HexaTech, Inc., Morrisville, NC (US)

( * ) Notice: Subject to any disclaimer, the term of this patent is extended or adjusted under 35 U.S.C. 154(b) by 0 days.

(21) Appl. No.: 14/208,760

(22) Filed: Mar. 13, 2014

(65) Prior Publication Data
US 2014/0264714 A1    Sep. 18, 2014

Related U.S. Application Data

(60) Provisional application No. 61/781,991, filed on Mar. 14, 2013.

(51) Int. Cl.
*H01L 29/872* (2006.01)
*H01L 29/66* (2006.01)
*H01L 29/20* (2006.01)

(52) U.S. Cl.
CPC ........ *H01L 29/872* (2013.01); *H01L 29/2003* (2013.01); *H01L 29/66212* (2013.01); *H01L 29/66462* (2013.01)

(58) Field of Classification Search
CPC .................. H01L 29/872; H01L 29/66212
USPC ......... 257/471, 472, 485, 615; 438/572, 604
See application file for complete search history.

(56) References Cited

U.S. PATENT DOCUMENTS

| | | | |
|---|---|---|---|
| 5,523,589 A | 6/1996 | Edmond et al. |
| 5,592,501 A | 1/1997 | Edmond et al. |
| 6,045,612 A | 4/2000 | Hunter |
| 6,066,205 A | 5/2000 | Hunter |
| 6,110,424 A | 8/2000 | Maiden et al. |
| 6,296,956 B1 | 10/2001 | Hunter |

(Continued)

FOREIGN PATENT DOCUMENTS

| | | | |
|---|---|---|---|
| JP | 2006278570 A | * | 10/2006 |
| JP | 2006290662 | | 10/2006 |

(Continued)

OTHER PUBLICATIONS

Schowalter et al., "Preparation and Characterization of Single-Crystal Aluminum Nitride Substrates," *Mat. Res. Soc. Symp.*, 2000, vol. 595, pp. W6.7.1-W6.7.6.

(Continued)

*Primary Examiner* — Michele Fan
(74) *Attorney, Agent, or Firm* — Womble Carlyle Sandridge & Rice LLP

(57) ABSTRACT

The invention provides a power semiconductor device including an aluminum nitride single crystalline substrate, wherein the dislocation density of the substrate is less than about $10^5$ cm$^{-2}$ and the Full Width Half Maximum (FWHM) of the double axis rocking curve for the (002) and (102) crystallographic planes is less than about 200 arcsec; and a power semiconductor structure comprising at least one doped $Al_xGa_{1-x}N$ layer overlying the aluminum nitride single crystalline substrate.

16 Claims, 2 Drawing Sheets

(56) References Cited

U.S. PATENT DOCUMENTS

| | | | |
|---|---|---|---|
| 6,579,495 B1 | 6/2003 | Maiden | |
| 6,690,035 B1* | 2/2004 | Yokogawa | H01L 29/045 257/194 |
| 6,888,170 B2 | 5/2005 | Schaff et al. | |
| 6,953,740 B2 | 10/2005 | Schaff et al. | |
| 7,501,023 B2 | 3/2009 | Dmitriev et al. | |
| 7,632,454 B2 | 12/2009 | Schlesser et al. | |
| 7,678,195 B2 | 3/2010 | Schlesser et al. | |
| 7,678,198 B2 | 3/2010 | Hartig | |
| 7,815,970 B2 | 10/2010 | Schlesser et al. | |
| 7,915,178 B2 | 3/2011 | Collazo et al. | |
| 8,080,833 B2 | 12/2011 | Grandusky et al. | |
| 8,123,859 B2 | 2/2012 | Schowalter et al. | |
| 8,222,650 B2 | 7/2012 | Schowalter et al. | |
| 8,455,909 B2 | 6/2013 | Negley | |
| 8,545,629 B2 | 10/2013 | Schowalter et al. | |
| 2002/0028291 A1 | 3/2002 | Shibata et al. | |
| 2005/0000913 A1 | 1/2005 | Betterly | |
| 2006/0138443 A1 | 6/2006 | Fan et al. | |
| 2006/0163126 A1 | 7/2006 | Maiden | |
| 2006/0216193 A1 | 9/2006 | Johnson et al. | |
| 2007/0029558 A1 | 2/2007 | Nishizono | |
| 2007/0086912 A1 | 4/2007 | Dowling et al. | |
| 2007/0096239 A1 | 5/2007 | Cao et al. | |
| 2007/0101932 A1 | 5/2007 | Schowalter et al. | |
| 2007/0131160 A1 | 6/2007 | Slack et al. | |
| 2007/0131872 A1 | 6/2007 | Shearer et al. | |
| 2007/0134827 A1 | 6/2007 | Bondokov et al. | |
| 2007/0159067 A1 | 7/2007 | Yun et al. | |
| 2007/0206164 A1 | 9/2007 | Beeson et al. | |
| 2007/0243653 A1 | 10/2007 | Morgan et al. | |
| 2007/0257333 A1 | 11/2007 | Schlesser et al. | |
| 2008/0003649 A1 | 1/2008 | Maltezos et al. | |
| 2008/0083970 A1 | 4/2008 | Kamber et al. | |
| 2008/0087914 A1* | 4/2008 | Li | 257/184 |
| 2008/0132040 A1 | 6/2008 | Wang et al. | |
| 2008/0182092 A1 | 7/2008 | Bondokov et al. | |
| 2008/0187016 A1* | 8/2008 | Schowalter | 372/45.011 |
| 2008/0199353 A1 | 8/2008 | Mlodzinski et al. | |
| 2009/0084734 A1 | 4/2009 | Yencho | |
| 2009/0250626 A1 | 10/2009 | Schlesser et al. | |
| 2010/0032682 A1 | 2/2010 | Zimmerman et al. | |
| 2010/0207166 A1* | 8/2010 | Zhu | 257/201 |
| 2010/0237254 A1 | 9/2010 | Mason et al. | |
| 2010/0242835 A1 | 9/2010 | Arena et al. | |
| 2010/0264460 A1 | 10/2010 | Grandusky et al. | |
| 2010/0301490 A1* | 12/2010 | Simin | H01L 29/41708 257/773 |
| 2010/0314551 A1 | 12/2010 | Bettles et al. | |
| 2011/0133262 A1* | 6/2011 | Wahl | 257/296 |
| 2011/0198643 A1 | 8/2011 | Kim | |
| 2012/0000414 A1 | 1/2012 | Bondokov et al. | |
| 2012/0240845 A1 | 9/2012 | Fukuyama et al. | |
| 2013/0168689 A1* | 7/2013 | Lee | 257/76 |
| 2014/0239305 A1* | 8/2014 | Shah | 257/76 |

FOREIGN PATENT DOCUMENTS

| | | |
|---|---|---|
| JP | 2010 042950 | 2/2010 |
| JP | 4565042 | 10/2010 |
| WO | WO 2008/042020 | 4/2008 |
| WO | WO 2009/090821 | 7/2009 |
| WO | WO 2009/090923 | 7/2009 |
| WO | WO 2010/001803 | 1/2010 |
| WO | WO2010-122933 | 10/2010 |

OTHER PUBLICATIONS

Tweedie et al., "Schottky Barrier and Interface Chemistry for Ni Contacted to $Al_{0.8}Ga_{0.2}N$ Grown on C-Oriented AlN Single Crystal Substrates," Phys. Status Solidi C9, 2012, vol. 9, No. 3-4, pp. 584-587.

Xie et al., "Ni/Au Schottky Diodes on $Al_xGa_{1-x}N$ (0.7<x<1) Grown on AlN Single Crystal Substates," Phys. Status Solidi C8, 2011, vol. 8, No. 7-8, pp. 2407-2409.

Bettles et al., "UV Light Emitting Diodes Their Applications and Benefits," IUVA News, vol. 9, No. 2, Jun. 2007, pp. 11-15.

Collazo et al. (2011) "Progress on n-type doping of AlGaN alloys on AlN single crystal substrates for UV optoelectronic applications," Physica Status Solidi C—Current Topics in Solid State Physics, vol. 8, pp. 7-8.

Collazo et al. "265 nm light emitting diodes on AlN single crystal substrates: Growth and characterization," (2011 Conference on Lasers and Electro-Optics (CLEO)), 2011.

Dalmau et al. "Characterization of dislocation arrays in AlN single crystals grown by PVT," Phys. status solidi A 2011, 208 (7), 1545-7.

Dalmau et al. "Growth and characterization of AlN and AlGaN epitaxial films on AlN single crystal substrates," Journal of the Electrochemical Society, 2011, 158(5), H530-H535.

Ehrentraut, et al. "Advances in bulk crystal growth of AlN and GaN," MRS Bulletin, 2009, vol. 34, (4), 259-265.

Herro et al. "Growth of AlN single crystalline boules," Journal of Crystal Growth, 2010, 312 (18) pp. 2519-2521.

Grandusky et al. "Performance and reliability of ultraviolet-C pseudomorphic light emitting diodes on bulk AlN substrates," Phys. Status Solidi C, 2010, vol. 7, pp. 2199-2201.

Lu et al., "Seeded growth of AlN bulk crystals in m- and c-orientation," Journal of Crystal Growth, 2009, 312(1), 58-63.

Raghothamachar et al. "Low defect density bulk AlN substrates for high performance electronics and optoelectronics," Materials Science Forum, 2012, vols. 717-720, pp. 1287-1290.

Alevli et al., "The Influence of N2/H2 and Ammonia N Source Materials on Optical and Structural Properties of AlN Films Grown by Plasma Enhanced Atomic Layer Deposition," Journal of Crystal Growth, 2011, pp. 51-57, vol. 335.

Collazo et al., "On the Origin of the 265 nm Absorption Band in AlN Bulk Crystals," Appl. Phys. Lett, 100, 2012, pp. 191914-1-191914-5.

Figge et al., "Temperature Dependence of the Thermal Expansion of AlN," Applied Physics Letters, 2009, 101915-1 to 101915-3, vol. 94.

Kumagai et al., "Preparation of a Freestanding AlN Substrate from a Thick AlN Layer Grown by Hydride Vapor Phase Epitaxy on a Bulk AIS Substrate Prepared by Physical Vapor Transport," Applied Physics Express, 5, 2012, pp. 055504-1-055504-3.

Mueller et al., "The Progress of AlN Bulk Growth and Epitaxy for Electronic Applications," Phys. Status Solidi A, 2009, pp. 1-7.

Nagashima et al., "Structural and Optical Properties of Carbon-Doped AlN Substrates Grown by Hydride Vapor Phase Epitaxy Using AlN Substrates Prepared by Physical Vapor Transport," Applied Physics Express, 2012, vol. 5, pp, 125501-1 to 125501-3.

Raghothamachar et al., "X-ray Characterization of Bulk AlN Single Crystals Grown by the Sublimation Technique," Journal of Crystal Growth, 2003, pp. 244-250, vol. 250.

Rojo et al., "Report on the Growth of Bulk Aluminum Nitride and Subsequent Substrate Preparation," Journal of Crystal Growth, 2001, pp. 317-321, vol. 231.

Schlesser et al., "Seeded Growth of AlN Bulk Single Crystals by Sublimation," Journal of Crystal Growth, 2002, pp. 416-420, vol. 241.

Weiwei et al., "Wet Etching and Infrared Absorption of AlN Bulk Single Crystals," Journal of Semiconductors, 2009, pp. 073002-1 to 073002-4, vol. 30, No. 7.

Crystal IS, "Optam (data sheet)," www.cisuvc.com, 2014, 8 pages.

Kitamura et al., "Reliability and Lifetime of Pseudomorphic UVC LEDs on AlN Substrate Under Various Stress Condition," IEEE Lester Eastman Conference on High Performance Devices (LEC), 2014, 5 pages.

Osram Opto Semiconductors, "Reliability and Lifetime of LEDs," (brochure) 2013, pp. 1-14.

Sensor Electronic Technology, Inc., "Sensor Electronic Technology, Inc. achieves more than 10,000 hours lifetime on UVTOP® ultraviolet LEDs," (press release) 2011, 1 page.

US Department of Energy, Energy Efficiency and Renewable Energy, "Lifetime of White LEDs," Building Technologies Program (brochure), 2009, 2 pages.

(56) References Cited

OTHER PUBLICATIONS

Wunderer, et al., "Optically pumped UV lasers grown on bulk AlN substrates," *Phys. Status Solidi C*, 2012, pp. 1-4, vol. 9, Nos. 3-4.

* cited by examiner

POWER SEMICONDUCTOR DEVICES INCORPORATING SINGLE CRYSTALLINE ALUMINUM NITRIDE SUBSTRATE

CROSS-REFERENCE TO RELATED APPLICATIONS

This application claims priority to U.S. Provisional Application No. 61/781,991, filed Mar. 14, 2013, which is herein incorporated by reference in its entirety.

FIELD OF THE INVENTION

The present invention relates to power semiconductor devices incorporating an aluminum nitride single crystalline substrate layer.

BACKGROUND OF THE INVENTION

Power electronics semiconductor technology has made a tremendous contribution to modern society by providing routine, high-quality electric power at dependable voltage, current and frequency, regardless of load. Such devices are used as a switch or rectifier and can be classified as two-terminal devices (e.g., diodes) or three-terminal devices (e.g., triodes). Power semiconductor devices can also be classified as a majority carrier device that uses only one type of charge carrier (electron or electron holes) and minority carrier devices that use both carrier types. Examples of majority carrier devices include Schottky diodes, Junction Field Effect Transistors (JFET), and Power Metal Oxide Semiconductor Field Effect Transistors (MOSFET). Minority carrier devices include thyristors, Bipolar Junction Transistors (BJT), PIN diodes, and Insulated Gate Bipolar Transistors (IGBT).

The electric utility infrastructure in the U.S. is transforming to add better control, better monitoring and intelligence to the transmission and distribution of electric power. This future "smart grid" will provide not just on-off control, but actual flow-control of electric power in response to changing conditions and demand. The development of improved power control devices is a critical enabler for the smart grid.

Until recently, these types of devices were based on silicon (Si) semiconductor devices, which are generally quite efficient in the operating voltage range below 480 Vac and temperatures below 50° C. For electric utility applications, these devices suffer from a number of limitations, including low blocking voltage (≤10 KV), low switching speeds (≤2 KHz) and limited junction-operating temperatures (≤150° C.).

To penetrate the sizeable electric power system application space from 480 Vac to 500 kVac with flexible power control and energy savings, new power semiconductor technology must be developed. Because the fundamental materials limitations of Si render it inadequate, semiconductors with wider energy band-gap must be used. Silicon carbide (SiC) power control devices have been in development for at least 20 years, and research-scale devices at the 10-20 kV level have been reported, including SiC Schottky diodes and JFETs. Silicon carbide is advantageous due to lower thermal resistance and the ability to operate at a higher temperature, as compared to silicon.

However, as the voltage level becomes higher and higher, losses in these devices also increase significantly, limiting the device's current handling capability. A semiconductor with drastically better materials properties is needed; one that will enable power electronics with the highest operating temperature, greatly reduced forward conduction losses and blocking voltage capability beyond 20 kV. Accordingly, there remains a need in the art for improved power semiconductor devices.

SUMMARY OF THE INVENTION

The present invention provides power semiconductor devices comprising an aluminum nitride (AlN) single crystalline substrate, wherein the dislocation density of the substrate is less than about $10^5$ cm$^{-2}$ and the Full Width Half Maximum (FWHM) of the double axis rocking curve for the (002) and (102) crystallographic planes is less than about 200 arcsec; and a power semiconductor structure comprising a plurality of epitaxial doped $Al_xGa_{1-x}N$ layers overlying the aluminum nitride single crystalline substrate. In certain embodiments, power semiconductor devices of the invention are capable of providing breakdown fields of at least about 5 MV/cm (e.g., at least about 10 MV/cm, at least about 15 MV/cm, or at least about 20 MV/cm), blocking voltages of at least about 20 kV, and/or a switching frequency of at least about 20 kHz. Exemplary power semiconductor structures are those in the form of a Schottky diode, a Junction Field Effect Transistors (JFET), or a Power Metal Oxide Semiconductor Field Effect Transistors (MOSFET).

In certain embodiments, the substrate can be characterized by a dislocation density of lower than $10^4$ cm$^{-2}$, lower than $10^3$ cm$^{-2}$, or lower than $10^2$ cm$^{-2}$. The FWHM of the double axis rocking curve for the (002) and (102) crystallographic planes can be less than about 100 arcsec, less than about 50 arcsec, or less than about 25 arcsec. The aluminum nitride single crystalline substrate is typically prepared by physical vapor transport.

In one exemplary embodiment, the power semiconductor structure is in the form of a Schottky diode comprising a relatively lightly doped N–type drift region comprising one or more epitaxial $Al_xGa_{1-x}N$ layers adjacent to a relatively heavily doped N+ region comprising one or more epitaxial $Al_xGa_{1-x}N$ layers. The value of x can vary, depending on the location of the $Al_xGa_{1-x}N$ layer, with typical values of x being between about 0 and about 0.8 in the N+ region and greater than about 0.7 or greater than about 0.8 in the drift region.

The present invention also provides a method of forming a power semiconductor device, which comprises receiving an aluminum nitride single crystalline substrate, wherein the dislocation density of the substrate is less than about $10^5$ cm$^{-2}$ and the FWHM of the double axis rocking curve for the (002) and (102) crystallographic planes is less than about 200 arcsec; depositing a plurality of epitaxial doped $Al_xGa_{1-x}N$ active layers on the aluminum nitride single crystalline substrate; removing at least a portion of the aluminum nitride single crystalline substrate; and forming metal electrode layers in contact with the doped $Al_xGa_{1-x}N$ active layers. Exemplary deposition techniques include molecular-beam epitaxy (MBE), metal organic chemical vapor deposition (MOCVD), and Hydride Vapor Phase Epitaxy (HYPE). In one embodiment where the power semiconductor structure is in the form of a Schottky diode, the depositing step comprises depositing one or more relatively heavily doped N+ $Al_xGa_{1-x}N$ layers on the aluminum nitride single crystalline substrate and depositing one or more relatively lightly doped N–type $Al_xGa_{1-x}N$ layers on the relatively heavily doped N+ $Al_xGa_{1-x}N$ layers.

BRIEF DESCRIPTION OF THE DRAWINGS

Figure 1:
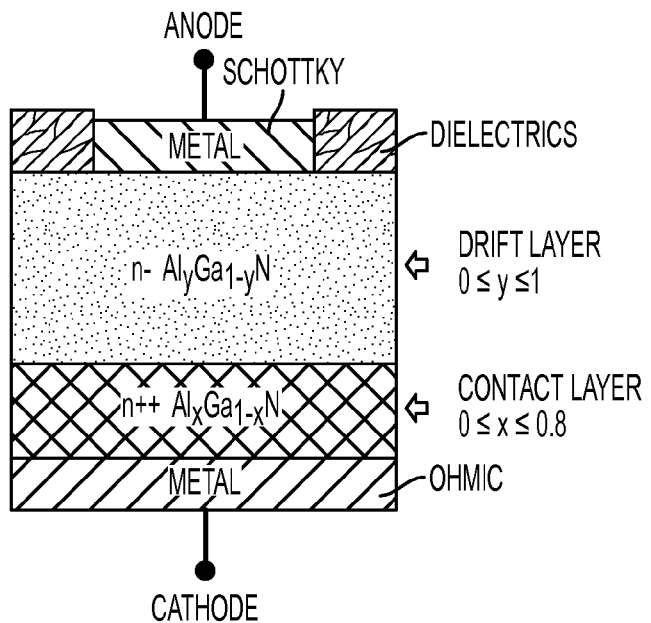
Figure 2:
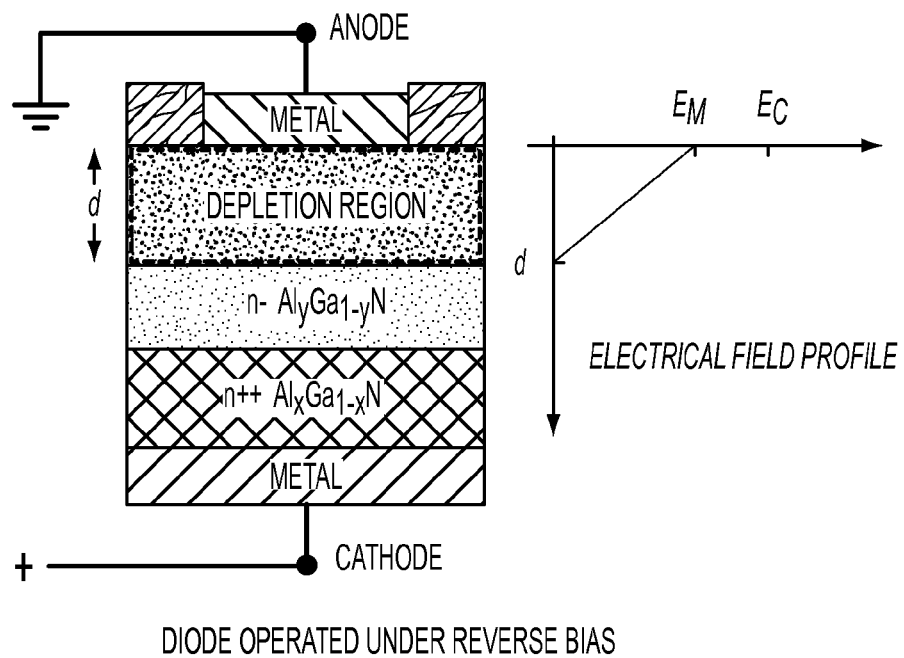
Figure 3:
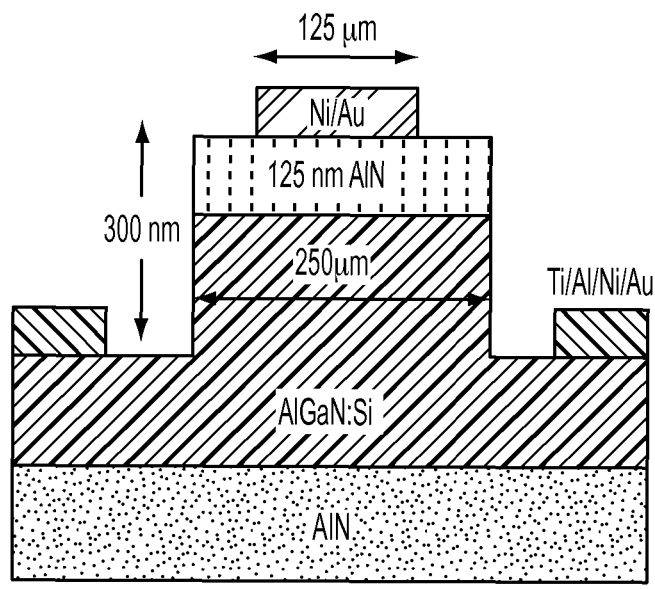
Figure 4:
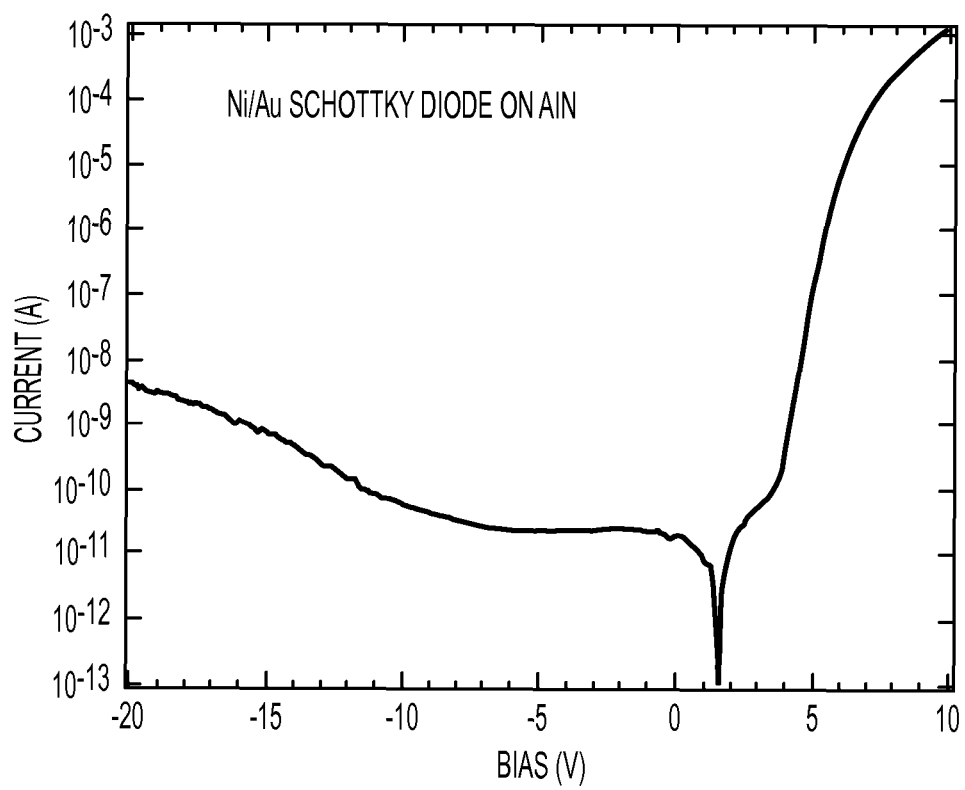

Having thus described the disclosure in the foregoing general terms, reference will now be made to the accompanying drawings, which are not necessarily drawn to scale, and wherein:

FIG. 1 illustrates an exemplary Schottky diode according to the invention;

FIG. 2 illustrates the effect of a reverse bias applied to the anode of the Schottky diode of FIG. 1;

FIG. 3 illustrates the structure of a Schottky diode grown on a single crystal AlN substrate as discussed in the Experimental; and FIG. 4 graphically illustrates the current-voltage curve for the exemplary device discussed in the Experimental.

DETAILED DESCRIPTION OF THE INVENTION

The present disclosure will now be described more fully hereinafter with reference to exemplary embodiments thereof. These exemplary embodiments are described so that this disclosure will be thorough and complete, and will fully convey the scope of the disclosure to those skilled in the art. Indeed, the present disclosure may be embodied in many different forms and should not be construed as limited to the embodiments set forth herein; rather, these embodiments are provided so that this disclosure will satisfy applicable legal requirements. As used in the specification, and in the appended claims, the singular forms "a", "an", "the", include plural referents unless the context clearly dictates otherwise.

Embodiments of the present invention relate to power semiconductor devices. As used herein, the term "power semiconductor device" is intended to refer to devices constructed of semiconductor material and adapted for control or conversion of electric current, including switches and rectifiers. These devices can be two-terminal or three-terminal devices and either majority carrier or minority carrier devices, specifically including Schottky diodes, Junction Field Effect Transistors (JFET), Power Metal Oxide Semiconductor Field Effect Transistors (MOSFET), thyristors, Bipolar Junction Transistors (BJT), PIN diodes, and Insulated Gate Bipolar Transistors (IGBT). Power diodes (including Schottky diodes) are a particularly important class of such devices, which provide rectification of power and which are used in a variety of applications including electroplating, anodizing, battery charging, welding, power supplies (dc and ac), and variable frequency drives.

In accordance with the present invention, the power semiconductor devices are fabricated on single crystalline AN substrates with low dislocation density prepared by physical vapor transport (PVT). AN has a very high critical electric field, which is related to achieving a high blocking voltage in the off-state. Both critical electric field and blocking voltage are strongly reduced by material with a high dislocation density. Accordingly, because the AlN substrates used in the present invention exhibit a very low dislocation density, the substrates can be used to produce power semiconductor device structures that realize the exceptionally high critical field.

Although usually considered as a dielectric, AlN, as well as alloys of AlN and GaN, display significant thermal conductivity and hold the promise of good electronic mobility, high aluminum content, alloys of $Al_xGa_{1-x}N$. The combination of these favorable thermal properties with wide electronic band-gaps allows fabrication of high-speed power control devices with exceptionally high breakdown fields. In certain embodiments, the present invention can provide majority carrier power devices with breakdown fields on the order of at least about 5 MV/cm, at least about 10 MV/cm, at least about 15 MV/cm, or at least about 20 MV/cm. Accordingly, power devices fabricated from $Al_xGa_{1-x}N$ (x>0.8) according to the invention have the potential to demonstrate a 200:1 improvement in breakdown voltage over Si devices with the same specific on resistance.

AlN Substrate

III-nitride semiconductor materials with a low defect density can be used to fabricate high performance power semiconductor devices. Minimizing the difference between the lattice constants of the substrate and the device layers results in a lower dislocation density throughout the device. Therefore, it is desirable to use AlN or GaN single crystals as substrates for III-nitride based devices, since the use of these native III-nitride substrates minimizes the difference in lattice constant between the substrate and the device layers. The use of substrates with low dislocation density is preferable because dislocations present in the substrate tend to propagate into the device layers.

In the present invention, AlN single crystal substrates are particularly preferred, and such substrates can be c-plane, m-plane, a-plane, or r-plane. "Single crystal" refers to the crystal having ordered lattice atoms with one orientation in 3-D. A power semiconductor device built on a single crystal substrate will inherit the crystalline orientation of the substrate. By contrast, "polycrystalline" refers to the presence of many orientations with many grain boundaries, which are absent in the single crystal. As applied to the substrates of the invention, "single crystal substrate" refers to the presence, at a minimum, of at least one single crystal surface available for growth of a power semiconductor device, which would include substrates that have a homogenous single crystal structure throughout its thickness as well as substrates having a single crystal layer bonded to another substrate. Single crystalline AlN is an III-nitride semiconductor material that features a direct bandgap of approximately 6 eV. This represents a larger bandgap than other nitrides such as GaN and InN, and it is therefore possible to alloy AlN with Ga or In in order to engineer the bandgap energy.

Processes for preparing the single crystal AlN substrate can vary, but will typically involve physical vapor transport as opposed to chemical vapor deposition (CVD) techniques that involve chemical reaction of precursor molecules to form the desired material, meaning the preferred process involves physical transport of a vapor of the desired material (i.e., AlN) from an AlN source to a deposition location in a crucible or other crystal growth chamber. The deposition area typically includes a single crystal AlN seed material and the growth process is typically conducted in an inductively-heated reactor. Seeded PVT growth processes for growing single crystal AlN substrates suitable for use in the present invention are set forth, for example, in U.S. Pat. No. 7,678,195 to Schlesser et al; Ehrentraut, D., & Sitar, Z. (2009) Advances in bulk crystal growth of AlN and GaN, MRS Bulletin, 34(4), 259-265; Lu et al. (2009) Seeded growth of AlN bulk crystals in m- and c-orientation, Journal of Crystal Growth, 312(1), 58-63; and Herro et al. (2010) Growth of AlN single crystalline boules, Journal of Crystal Growth, 312 (18) 2519-2521, the entire disclosure of each being hereby incorporated by reference. Single crystal AlN substrates suitable for use in the present invention are commercially available from HexaTech, Inc. of Morrisville, N.C. Crucibles useful in PVT crystal growth processes are set forth in U.S. Pat. No. 7,632,454 to Schlesser et al., which is also incorporated by reference herein. See also the disclosure in U.S. Pat. Nos. 7,815,970 to Schlesser et al. and 7,915,178 to Collazo et al., both of which are incorporated by reference herein.

Evaluation of the quality of a single crystal substrate can be based on several measurements, including counting dislocation density. Exemplary techniques for measuring defects in single crystal structures are known in the art, such as those techniques set forth, for example, in Dalmau et al. (2011) Characterization of dislocation arrays in AlN single crystals grown by PVT, Phys. status solidi A 208 (7), 1545-7 and Raghothamachar et al. (2012) Low defect density bulk AlN substrates for high performance electronics and optoelectronics, Materials Science Forum 717-720, 1287-90, both of which are incorporated by reference herein.

One method used to characterize the lattice distortion in single-crystal wafer substrates is to directly image the dislocation in the crystal by X-ray topography by using synchrotron radiation sources. See e.g., X-Ray Topography-NIST Recommended Practice Guide, National Institute of Standards and Technology, the entire disclosure of which is hereby incorporated by reference. Dislocation density can be observed by plan-view-imaging. The dislocation density is calculated by dividing the total number of dislocations by the area of the view field.

The dislocation density of the single crystalline AN substrates described herein is preferably less than about $10^5$ cm$^{-2}$, more preferably less than about $10^4$ cm$^{-2}$, and most preferably less than about $10^3$ cm$^{-2}$. In certain embodiments, the dislocation density of the AlN substrate is less than or equal to about $10^2$ cm$^{-2}$.

For a sample with a relatively low dislocation density, it can be necessary to etch a mechanically polished crystal surface using, for example, a 1:1 ratio by weight mixed solution of potassium hydroxide and sodium hydroxide, at 300° C. for 5 to 10 min. After etching, the etched surface is observed and the number of etch pits is counted by electron microscopy or optical microscopy. The dislocation density is then estimated by dividing the number of observed etched pits by the area of the view field.

Imperfect surface preparation of the substrate can also increase the dislocation density of the resulting device. Accordingly, surface preparation techniques can be utilized to obtain an ideal surface for epitaxial growth without generating new dislocations from the interface. In an embodiment of the present invention, the AlN substrate surface is prepared by grinding, followed by chemo-mechanical polishing to reduce residual surface roughness. AlN substrate treatment processes can also include reactive ion etching or wet etching using an alkaline solution. Details of the polishing process are not particularly limiting to the present invention. Planarization processing by dry etching can also be used. A very smooth and flat substrate surface, consisting of atomic steps, is desirable regardless of the surface preparation method used.

High resolution X-ray diffraction (HRXRD) is another standard method used to characterize the lattice distortion in single crystal substrates. See e.g., NIST High Resolution X-Ray Diffraction Standard Reference Material: SRM 2000 link: http://www.nist.gov/manuscript-publication-search.cfm?pub_id=902585, the entire disclosure of which is hereby incorporated by reference. See also, High Resolution X-Ray Diffractometry And Topography by D. K. Bowen, B. K. Tanner, CRC Press 1998, the entire disclosure of which is hereby incorporated by reference. The dislocation density can be characterized by FWHM of the rocking curve (RC) in HRXRD measurement. A narrow peak suggests less lattice disorder in the crystal, which means low dislocation density. Specifically, the FWHM of X-ray RCs for the crystallographic plane of AlN substrates used in the present invention is preferably less than about 200 arcsec, less than about 100 arcsec, less than about 50 arcsec, or less than about 25 arcsec. Exemplary ranges include about 1 to about 200 arcsec, about 5 to about 50 arcsec, and about 10 to about 25 arcsec. XRD measurements can be performed with a Philips X'Pert MRD diffractometer using Cu K$\alpha_1$ radiation of $\lambda$=1.540 56 Å. The x-ray tube can be in point focus set to 40 kV 45 mA. The double-axis configuration can utilize a Ge (2 2 0) four-bounce monochromator and an open detector. The spot size of the X-ray beam can be approximately 10 mm.

Power Semiconductor Device Structures

The precise structure and method of preparation for the power semiconductor devices of the invention can vary, but will typically involve epitaxial growth, mounting, and packaging processes known in the art. Each power semiconductor device according to the invention is grown on the AlN substrates described herein and contains multiple active layers in the form of N–type and/or P-type semiconductor layers (e.g., Si-doped Al$_x$Ga$_{1-x}$N layers).

The exact device structure will depend on the device type. For example, a MOSFET according to the invention can have, for example, a conventional four-terminal structure including a gate, source, drain, and body as known in the art. A Schottky diode structure according to the invention can have, for example, the structure shown in FIG. 1, with an N–type lightly doped drift layer formed on an N+ type heavily doped layer. At least a portion of the surface of the N–type doped drift layer is in contact with a metal layer as an anode. The contact region between the metal layer (labeled Schottky metal) and the N–type doped drift layer forms a Schottky barrier. At least a portion of the surface of the N+ type doped layer is in contact with an ohmic metal layer as a cathode. Exemplary electrode metals include titanium, aluminum, and gold, as well as combinations thereof. Although the illustrated device is vertically arranged, laterally arranged diode structures could also be used in the present invention.

The N+ type contact region of the Schottky diode will typically consist of one or more Si-doped Al$_x$Ga$_{1-x}$N layers, where x is between about 0 and about 0.8 (e.g., about 0.2 to about 0.8). The N–type drift region of the Schottky diode will typically consist of one or more Si-doped Al$_y$Ga$_{1-y}$N layers, where y is between about 0 and about 1. Advantageously, y is greater than about 0.7 or greater than about 0.8 (including pure AlN) in the drift region.

When a reverse bias is applied to the anode, as shown in FIG. 2, the device is in the off-state; the applied voltage is supported by a depletion region in the drift region which is formed at the interface between the Schottky metal and N-drift region and expanded toward the cathode. The maximum electric field ($E_M$) is at the interface between the Schottky metal and the N-drift region; the applied bias can be increased until the maximum electric field reaches the critical electric field ($E_C$) of the semiconductor.

As mentioned above, the breakdown voltage is determined by the critical electric field of semiconductor. Wide band gap materials such as AlN, GaN, and SiC have higher critical electric field than Si. This means that the AlN or AlGaN Schottky diodes of the invention can achieve higher breakdown voltage compared with Si Schottky diodes. The relation between the breakdown voltage (BV) and the specific resistance of drift region ($R_D$) is given by $$R_D = \frac{4BV^2}{\mu\varepsilon E_C^3}$$

where µ is the carrier mobility, ε is the permittivity, and $E_C$ is the critical electric field of semiconductor. Therefore, the Schottky diode based on AlN or AlGaN can achieve a high breakdown voltage with a low specific resistance compared with the device based on Si.

Method of Fabricating Power Semiconductor Devices of the Invention

The power semiconductor device structures discussed herein can be formed by epitaxial growth processes known in the art, such as molecular-beam epitaxy (MBE), metal organic chemical vapor deposition (MOCVD), Hydride Vapor Phase Epitaxy (HVPE), liquid phase epitaxy (LPE), or the like. MOCVD processes are preferable in order to control the thickness of the device layers as well as the incorporation of dopants. Methods for forming doped layers of AlGaN alloys are discussed, for example, in U.S. Pat. Nos. 6,888,170; 6,953,740; 7,482,191; and 7,485,901, all to Schaff et al, which are incorporated by reference herein.

Many single crystalline substrates are C-plane substrates. Regardless of the epitaxy method used, the deposited layers become a continuation of the substrate's crystal structure. Therefore, in order to achieve a low dislocation density throughout all layers of the device, a substrate with a low dislocation density is necessary as described above.

Control of carbon and oxygen incorporation during device layer growth is important and can be accomplished by utilizing "carbon-free" processes, such as MBE and HVPE, and by utilizing supersaturation schemes for control of carbon by MOCVD. In certain embodiments, the carbon concentration in the active layers is maintained below about $10^{16}$ cm$^{-3}$. For AlGaN films grown by MOCVD, it is preferred to obtain controllable n-type carrier concentrations in the $5\times10^{16}$–$5\times10^{17}$ cm$^{-3}$ range for high-Al content films. Quantum wells of Si-doped $Al_xGa_{1-x}N$ (x is >0.7 or >0.8) can be utilized as the drift region in the power semiconductor devices of the invention. Following active layer deposition, the single crystal substrate can be at least partially removed or thinned if desired, and metal electrode layers are formed in contact with the active layers.

Transmission electron microscopy ("TEM") is a standard method used to characterize the lattice distortion in substrate and device layers. The dislocation in the crystal can be directly imaged by using electron beams transmitted through ultra thin substrate specimens. An image is formed from the interaction of the electrons transmitted through the specimen.

In various embodiments of the present invention, cross-sectional TEM analysis of the device layers can be used to confirm that no additional dislocations are formed at the substratedevice layer interface, and, therefore, it can be concluded that the dislocation density in the device layers is essentially identical to that of the substrate.

Method of Using Power Semiconductor Devices of the Invention

The power semiconductor devices of the invention could be used in any application known for such devices, including applications in electricity distribution. The next major revolution in power electronics is expected to involve use of high-frequency power conversion techniques in the electricity distribution power grid (medium voltage system) and thus displace the traditional 60 Hz electromagnetic transformer. However, this requires high-voltage, high-frequency power semiconductor devices. AN based devices of the type described herein are ideal for building a device that can operate at >20 kV and switch at >20 kHz. For example, power semiconductor devices of the invention could be employed as high-voltage switches and/or high-voltage rectifiers, even those needing to be 20 kV-class devices, and such devices would be expected to have an ultra-low reverse recovery loss.

EXPERIMENTAL

Aspects of the present invention are more fully illustrated by the following example, which is set forth to illustrate certain embodiments of the invention and not to be construed as limiting thereof.

A Schottky diode structure of FIG. 3 was epitaxially grown on a single crystal AlN substrate fabricated from an AlN boule grown using HexaTech's PVT process, which is routinely capable of producing material with an average dislocation density lower than $10^4$ cm$^{-2}$. TEM imaging of a cross-section of the diode structure revealed sharp and abrupt interfaces between lawyers with no visible dislocations.

The Si-doped contact region grown on the substrate is characterized as having the composition $Al_{0.79}Ga_{0.21}N$ and the drift region grown on the contact region was lightly doped AlN. HRXRD measurements indicated that the drift region was 125 nm thick and the contact region was 522 nm thick.

FIG. 4 provides the I-V curve for the experimental device. As shown, the device demonstrated very low leakage current under reverse bias. Additionally, the breakdown field of the experimental device was measured under several conditions: (1) in air; (2) under vacuum; and (3) surface "passivated" with a FOMBLIN® lubricant. The measured breakdown field was approximately 5 MV/cm in each case (the tested diode in 1 m ton gave the best performance of 5.7 MV/cm), which significantly exceeds the theoretical maximum breakdown field of SiC. It is believed that the measured breakdown value resulted from a surface breakdown and is not indicative of the theoretical breakdown field for an optimized device, which could exceed about 15 MV/cm.

Many modifications and other aspects of the disclosure set forth herein will come to mind to one skilled in the art to which the disclosure pertains having the benefit of the teachings presented in the foregoing descriptions and the associated drawings. Therefore, it is to be understood that the disclosure is not to be limited to the specific aspects disclosed and that modifications and other aspects are intended to be included within the scope of the claims. Although specific terms are employed herein, they are used in a generic and descriptive sense only and not for purposes of limitation.

What is claimed is:

1. A power semiconductor device, comprising:
    an aluminum nitride single crystalline substrate, wherein the dislocation density of the substrate is less than about $10^5$ cm$^{-2}$ and the Full Width Half Maximum (FWHM) of the double axis rocking curve for the (002) and (102) crystallographic planes is less than about 200 arcsec; and
    a power semiconductor structure comprising a plurality of epitaxial doped $Al_xGa_{1-x}N$ layers overlying the aluminum nitride single crystalline substrate, wherein the dislocation density of each epitaxial layer is substantially the same as the dislocation density of the substrate;

wherein the power semiconductor device is characterized by a breakdown field of at least about 5 MV/cm.

2. The power semiconductor device of claim 1, wherein the dislocation density of the substrate is lower than $10^4$ cm$^{-2}$.

3. The power semiconductor device of claim 1, wherein the dislocation density of the substrate is lower than $10^3$ cm$^{-2}$.

4. The power semiconductor device of claim 1, wherein the dislocation density of the substrate is lower than $10^2$ cm$^{-2}$.

5. The power semiconductor device of claim 1, wherein the FWHM of the double axis rocking curve for the (002) and (102) crystallographic planes is less than about 100 arcsec.

6. The power semiconductor device of claim 1, wherein the FWHM of the double axis rocking curve for the (002) and (102) crystallographic planes is less than about 50 arcsec.

7. The power semiconductor device of claim 1, wherein the FWHM of the double axis rocking curve for the (002) and (102) crystallographic planes is less than about 25 arcsec.

8. The power semiconductor device of claim 1, wherein the power semiconductor structure is in the form of a Schottky diode, a Junction Field Effect Transistors (JFET), or a Power Metal Oxide Semiconductor Field Effect Transistors (MOSFET).

9. The power semiconductor device of claim 1, wherein the power semiconductor structure is in the form of a Schottky diode comprising a relatively lightly doped N-type drift region comprising one or more epitaxial $Al_xGa_{1-x}N$ layers adjacent to a relatively heavily doped N+ region comprising one or more epitaxial $Al_xGa_{1-}N$ layers.

10. The power semiconductor device of claim 9, wherein at least one layer of doped $Al_xGa_{1-}N$ has a value for x greater than about 0.7.

11. The power semiconductor device of claim 1, wherein the aluminum nitride single crystalline substrate is prepared by physical vapor transport.

12. The power semiconductor device of claim 1, wherein the power semiconductor device is characterized by one or more of the following:
    a blocking voltage of at least about 20 kV; and
    a switching frequency of at least about 20 kHz.

13. The power semiconductor device of claim 1, wherein the power semiconductor device is a Schottky diode.

14. A method of forming a power semiconductor device, comprising:
    receiving an aluminum nitride single crystalline substrate, wherein the dislocation density of the substrate is less than about $10^5$ cm$^{-2}$ and the Full Width Half Maximum (FWHM) of the double axis rocking curve for the (002) and (102) crystallographic planes is less than about 200 arcsec;
    depositing a plurality of epitaxial doped $Al_xGa_{1-}N$ active layers on the aluminum nitride single crystalline substrate, wherein the dislocation density of each epitaxial layer is substantially the same as the dislocation density of the substrate; and
    forming metal electrode layers in contact with the doped $Al_xGa_{1-}N$ active layers,
    wherein the power semiconductor device is characterized by a breakdown field of at least about 5 MV/cm.

15. The method of claim 14, wherein the depositing step comprises molecular-beam epitaxy (MBE), metal organic chemical vapor deposition (MOCVD), or Hydride Vapor Phase Epitaxy (HVPE).

16. The method of claim 14, wherein the power semiconductor structure is in the form of a Schottky diode and the depositing step comprises depositing one or more relatively heavily doped N+ $Al_xGa_{1-}N$ layers on the aluminum nitride single crystalline substrate and depositing one or more relatively lightly doped N-type $Al_xGa_{1-x}N$ layers on the relatively heavily doped N+ $Al_xGa_{1-x}N$ layers.

* * * * *